United States Patent [19]

Maemura

[11] Patent Number: 5,173,622
[45] Date of Patent: Dec. 22, 1992

[54] SOURCE COUPLED LOGIC CIRCUIT WITH REDUCED POWER CONSUMPTION

[75] Inventor: Kousei Maemura, Itami, Japan

[73] Assignee: Mitsubishi Denki Kabushiki Kaisha, Tokyo, Japan

[21] Appl. No.: 669,012

[22] Filed: Mar. 13, 1991

[30] Foreign Application Priority Data

Aug. 27, 1990 [JP] Japan .................. 2-225481

[51] Int. Cl.⁵ .......................... H03K 17/16
[52] U.S. Cl. .................. 307/446; 307/443; 307/448
[58] Field of Search ........... 307/443, 446, 448, 450, 307/475, 246, 296.8

[56] References Cited

U.S. PATENT DOCUMENTS

| | | | |
|---|---|---|---|
| 4,698,524 | 10/1987 | Plagens | 307/475 X |
| 4,701,643 | 10/1987 | Laude et al. | 307/450 |
| 4,701,646 | 10/1987 | Richardson | 307/446 X |
| 4,713,559 | 12/1987 | Vu et al. | 307/475 X |
| 4,798,979 | 1/1989 | Lee et al. | 307/450 |
| 4,918,336 | 4/1990 | Graham et al. | 307/446 X |
| 4,931,668 | 6/1990 | Kikuda et al. | 307/443 |
| 5,021,686 | 6/1991 | Kawata et al. | 307/448 |
| 5,027,007 | 6/1991 | LaRue et al. | 307/448 X |

FOREIGN PATENT DOCUMENTS 0341732  11/1989  European Pat. Off.
61-267413  4/1987  Japan.

*Primary Examiner*—David Hudspeth
*Attorney, Agent, or Firm*—Leydig, Voit & Mayer

[57] ABSTRACT

A semiconductor integrated circuit formed of a source coupled type logic circuit including a field effect transistor switching a circuit in response to an input signal and a current controlling circuit for controlling the input signal current connected in series between the input terminal and the gate of the field effect transistor. Since an element for limiting current is provided at the input, current is prevented from flowing into the circuit but the voltage of the input signal is sent to the circuit. As a result, the power consumption and the size of the circuit are reduced.

3 Claims, 4 Drawing Sheets

F I G. 1
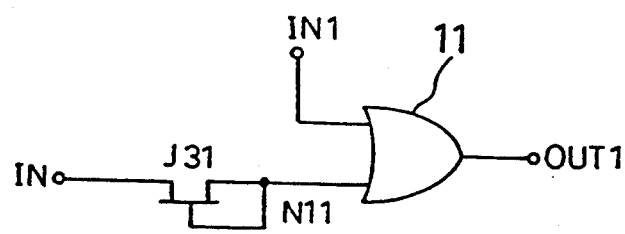
F I G. 2
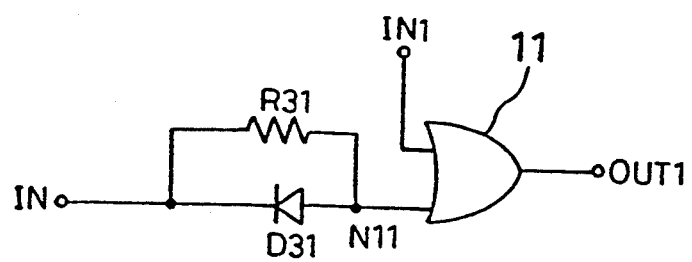

SOURCE COUPLED LOGIC CIRCUIT WITH REDUCED POWER CONSUMPTION

FIELD OF THE INVENTION

The present invention relates to a semiconductor integrated circuit and, more particularly, to a semiconductor integrated circuit with high performance and low power consumption which is formed by source coupled logic circuit using a junction type field effect transistor.

BACKGROUND OF THE INVENTION

A function switching circuit in a conventional integrated circuit will be described in reference to FIG. 5. In FIG. 5, reference numeral 11 designates an OR circuit, reference numeral 12 designates an input interface circuit, reference numeral IN1 designates a signal input to the OR circuit 11 in the integrated circuit, reference numeral OUT1 designates an output from the OR circuit 11 and reference numeral IN designates a signal input to the OR circuit 11 of the integrated circuit. In addition, reference numeral N11 designates an output signal from the input interface circuit 12.

Operation thereof will be described hereinafter.

The signal IN input becomes the signal N11 through the input interface circuit 12 and it is input to the OR circuit 11. When the signal IN is "High", the output OUT1 of the OR circuit 11 becomes "High" regardless of the input signal IN1. Alternatively, when the signal IN is "Low", the input signal IN1 appears in the output OUT1 of the OR circuit 11. Thus, switching between whether the signal IN1 is output or "High" is always output as the output signal OUT1 from the OR circuit 11 is performed in accordance with the input signal IN.

FIG. 6 is a view showing an example when the OR circuit 11 is constructed using a junction type field effect transistor (referred to as a JFET hereinafter). In FIG. 6, the same reference numbers as in FIG. 5 represent the same parts or parts having the same function. Reference numerals J11 to J16 designate JFETs, reference numerals R11 and R12 designate load resistors, reference numerals IN1 and IN1B designate the signal IN1 and its inverted signal in the circuit shown in FIG. 5 and reference character VDD designates a power supply voltage.

Next, operation thereof will be described hereinafter. The JFETs J13 and J16 are constant current sources and the load resistors R11 and R12 and the JFETs J11 and J12 switch in a differential manner and the JFETs J15 and J16 constitute a source follower circuit for outputting the switched signal.

First, when the signal N11 is "Low", lower than the signals IN1 and IN1B, the JFET J14 cuts off current, so that operation of the circuit is the same as when the JFET J14 is omitted. More specifically, the operation is the same as that of the normal source coupled type logic circuit. Its operation is as follows. That is, when a current flowing through one of the JFETs J11 and J12 whose gate voltage is higher with gate voltages IN1 and the IN1B, respectively, is increased, a large voltage drop occurs at the load resistor R11 or R12, and the resulting voltage is output through the source follower. For example, when the voltage of the IN1 is higher than that of the IN1B, a larger current flows through the JFET J11 and the current flowing through the JFET J12 is reduced, so that the voltage drop at the resistor R12 increases and the output voltage OUT becomes "High". Alternatively, when the voltage of the signal IN1 is lower than that of the signal IN1B, the current flowing through the J12 increases, so that the voltage drop at the resistor R12 is reduced and the output signal OUT becomes "Low".

When the N11 is "High", higher than IN1 and IN1B, since the J14 is always in a conductive state, a larger current flows through the resistor R11 and the current flowing through the resistor R12 is reduced regardless of the signals IN1 and IN1B and the output signal OUT becomes "High".

In order to operate as described above, as the signal N11, a voltage of "High", which is higher than the signal IN1 and the signal IN1B, and a voltage of "Low", which is lower than the signal IN1 and the signal IN1B are required, meaning that a large signal amplitude of approximately 2 V or more, is required. In addition, in a circuit in which its function can be switched from outside, a signal is input thereto from another outside circuit. When a CMOS IC is used as this circuit and when a 5 V supply voltage is used, the output from the CMOS IC is a voltage between 0 V and 5 V and a signal having a signal amplitude of 5 V from 0 V to 5 V is input as the signal IN.

Meanwhile, when the signal IN is directly input to the gate of the JFET, a gate current flows when the voltage between the gate and the source is higher than the gate junction voltage, which is approximately 1.2 V when the JFET is formed of GaAs, causing a large input current requirement. The circuit for switching the function could malfunction because of this current. In order to prevent this malfunction, the input interface circuit is provided as shown in FIG. 5.

FIG. 7 is a diagram showing a conventional input interface circuit. In FIG. 7, the same references as in FIG. 5 designate the same parts or parts having the same functions. In addition, reference numerals J21 and J22 designate JFETs and reference numeral D21 designates a diode.

Next, operation thereof will be described.

The voltage of the signal IN which is input from the outside causes a voltage drop in the voltage between the gate and the source (Vgs) of the JFET J21 at the JFET J21 and then a voltage drop in the forward direction voltage (Vf) of the diode D21 occurs at the diode D21, whereby the output signal N11 is obtained. As described above, even if the voltage of the output signal N11 is high, since the voltage is obtained from the following equation, that is, Vdd−Vgs−Vf, it will not be increased to the 5 V of the power supply voltage VDD. As a result, the above problems can be prevented.

However, since the conventional function switching circuit and the conventional input interface circuit for a function switching signal are constructed as described above, the current for the input interface circuit is required, whereby power consumption of the integrated circuit is increased.

SUMMARY OF THE INVENTION

The present invention was made in order to solve the above problems and it is an object of the present invention to provide a semiconductor integrated circuit with reduced power consumption.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, in a semiconductor integrated circuit comprising a source coupled logic circuit using a field effect transistor for the switching function circuit, a current limiting circuit is provided for the switching the output from this circuit is input to a gate of the function switching circuit.

According to an integrated circuit using a junction type field effect transistor of the present invention, since an element for limiting current is provided at the input switching signal, current is prevented from flowing into the circuit from the outside and also the voltage of the signal can be sent to the circuit. As a result, power consumption of the circuit is reduced while the same operation as in the conventional integrated circuit is performed.

BRIEF DESCRIPTION OF THE DRAWINGS

FIG. 1 is a view showing a structure of a junction type field effect transistor integrated circuit of a type which is controlled by a signal in accordance with a first embodiment of the present invention;

FIG. 2 is a view showing a structure of a junction type field effect transistor integrated circuit of a type which is controlled by a signal in accordance with a second embodiment of the present invention;

DESCRIPTION OF THE PREFERRED EMBODIMENTS

An embodiment of the present invention will be described in detail hereinafter.

Figure 5:
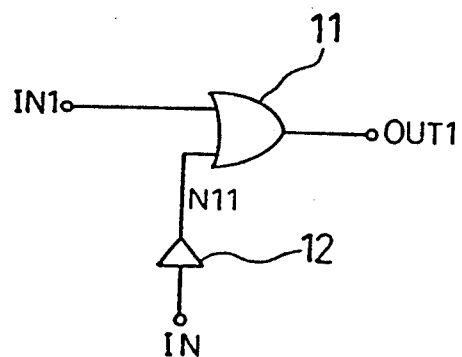
FIG. 5 is a view showing a structure of an integrated circuit of a type which is controlled by a signal in accordance with a conventional example.
Figure 6:
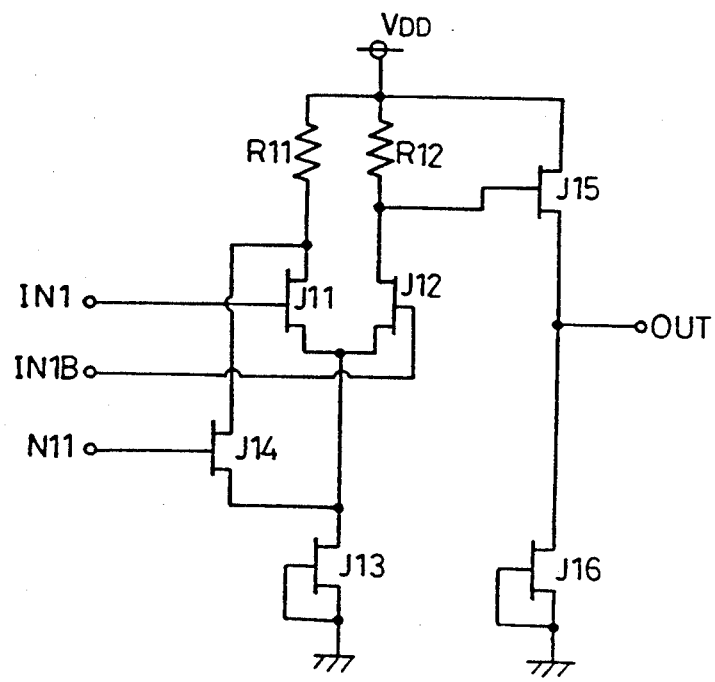
FIG. 6 is a view showing an example of an OR circuit of a type which is controlled by a signal.
Figure 7:
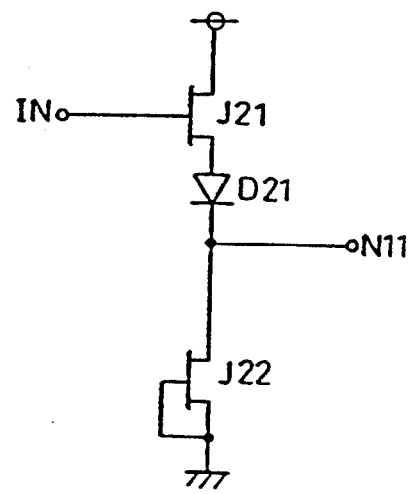
FIG. 7 is a view showing a conventional input interface circuit.

FIG. 1 is a view showing a function switching circuit using a junction type field effect transistor in a semiconductor integrated circuit in accordance with a first embodiment of the present invention. In FIG. 1, the same reference numbers in the function switching circuit formed by the input interface circuit and the OR circuit shown in FIG. 5 designate the same parts or parts having the same functions. In addition, reference numeral J31 designates a junction type field effect transistor (JFET). Reference character IN is an input signal and reference numeral N11 designates a signal input to the function switching circuit.

Next, operation thereof will be described hereinafter.

A gate is connected to a source in the JFET J31, whereby current is limited even if the voltage of the signal IN is higher than that of the signal N11. Since the input signal IN becomes N11 through the JFET J31 and is then input to the OR circuit 11, when the signal IN is "High", the output OUT1 of the OR circuit 11 is always "High" regardless of the input signal IN1. Alternatively, when the signal IN is "Low", the input signal IN1 appears as output OUT1 of the OR circuit 11. Thus, whether the signal IN1 is output or "High" is always output to the output signal OUT1 of the OR circuit 11 is switched in accordance with the input signal IN.

As described above, in accordance with the first embodiment of the invention, in addition to the same operation being performed as in the conventional integrated circuit having the switching function, even if the input voltage from the outside is as high as the supply voltage, the JFET J31 performs a current limiting operation and a voltage of the signal N11 does not become high.

For example, when a metal semiconductor junction type field effect transistor (referred to as an MESFET hereinafter) produced on a GaAs substrate is used as the JFET J31 and the threshold voltage, the gate length and the gate width of the MESFET are $-0.5$ V, 5 $\mu$m and 3 $\mu$m, respectively, the current of the signal IN flowing through the JFET J31 can be limited to the maximum of 30 $\mu$A.

According to the first embodiment, since the JFET J31 which can prevent current from the outside from flowing into the circuit and can transfer the voltage of an input signal to the circuit is provided for inputting the function switching signal, the same operation as in the conventional circuit can be implemented without using the input interface circuit with the result that power consumption is reduced and the size of the circuit is also reduced.

Next, a function switching circuit in a junction type field effect transistor integrated circuit in accordance with a second embodiment of the present invention will be described hereinafter in reference to FIG. 2.

In the circuit shown in FIG. 2, the same reference numbers as in FIG. 1 designate the same parts or parts having the same functions. In addition, reference numeral D31 designates a diode, reference numeral R31 designates a high resistance resistor connected in parallel with the diode D31.

Next, operation thereof will be described hereinafter.

The diode D31 inserted between the terminal IN and the terminal N11 connects the terminal IN to the terminal N11 capacitively and the signal passes through the diode D31 when the signal IN is a high speed signal. The high resistance resistor R31 inserted between the terminal IN and the terminal N11 transfers a low speed signal, whereby the integrated circuit performs the same operation as in the conventional example.

In addition, even if the input voltage IN is as high as the power supply voltage, since the D31 is under a reverse bias, the current flowing from the terminal IN to the terminal N11 passes through the resistor R31 only, with the result that the input current can be reduced. For example, when the resistance of the resistor R31 is 200K $\Omega$, the input current can be reduced to 25 $\mu$A or less.

According to the second embodiment, similar to the above embodiment, since the amount of current at the input part is reduced without using the input interface circuit, power consumption of the circuit is reduced.

Although the circuit for controlling current is formed of a JFET, or a diode and a resistor in the above first and second embodiments, the circuit can be constituted by other elements if the current can be controlled. Another example will be described hereinafter.

Figure 3:
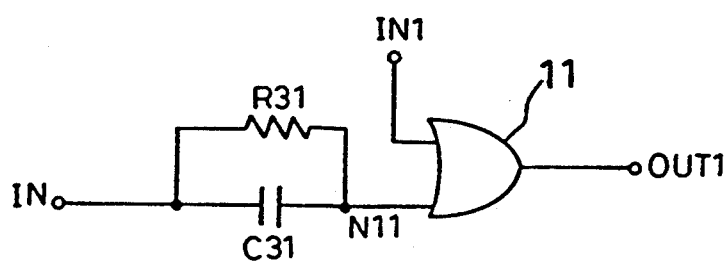
FIG. 3 is a view showing a structure of a junction type field effect transistor integrated circuit of a type which is controlled by a signal in accordance with a third embodiment of the present invention.
Figure 4A:
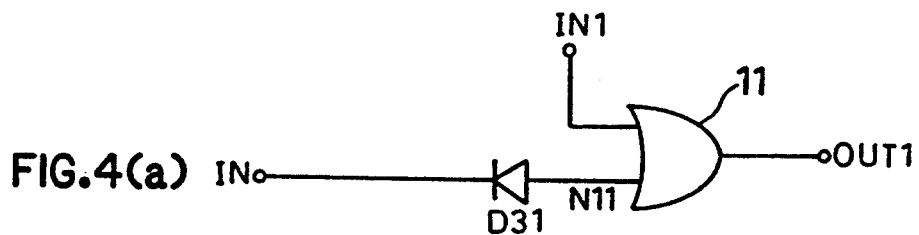
FIGS. 4(a) and 4(b) are views showing a structure of a junction type field effect transistor integrated circuit of a type which is controlled by a signal in accordance with a fourth embodiment of the present invention; and an equivalent input circuit, respectively
Figure 4B:
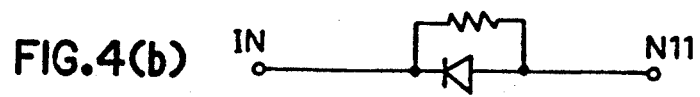

FIG. 3 shows a third embodiment of the present invention including a current controlling circuit for inputting a function switching signal, which comprises a parallel connection of a high resistance resistor R31 and a capacitor C31. FIGS. 4(a) and 4(b) show a fourth embodiment of the present invention in which a current controlling circuit comprises only a diode D31 and an equivalent circuit thereof, respectively. Operation of the current controlling circuits is the same as in the above embodiments, in which the current flowing from the terminal IN to the terminal N11 is reduced by respective resistor components when the input voltage IN becomes as high as the power supply voltage.

As described above, when the input voltage IN is as high as the supply voltage, the input current is reduced by the above circuit and the same effect as in the above embodiments can be obtained.

According to the integrated circuit using a junction type field effect transistor of the present invention, since the element for controlling a current is provided at the input of a function switching circuit, a current from the outside is prevented from flowing into the circuit and the potential of a signal from the outside can be introduced into the circuit. As a result, while the same operation as in the conventional integrated circuit is performed, the conventional input interface circuit can be dispensed with and power consumption of the circuit is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit including an input terminal, a source coupled logic circuit having a first field effect transistor including a source, a gate, and a drain for switching the function of the circuit in response to an input signal applied to said input terminal and a diode having a cathode and an anode with the cathode connected to said input terminal and the anode connected to the gate of said first field effect transistor and a resistor connected in parallel with said diode as current controlling means for controlling current flow.

2. A semiconductor integrated circuit including an input terminal, a source coupled logic circuit having a first field effect transistor including a source, a gate, and a drain for switching the function of the circuit in response to an input signal applied to said input terminal and a capacitor and a resistor connected in parallel between said input terminal and the gate of the field effect transistor as current controlling means for controlling current flow.

3. A semiconductor integrated circuit including an input terminal, a source coupled logic circuit having a first field effect transistor including a source, a gate, and a drain for switching the function of the circuit in response to an input signal applied to said input terminal and a diode having a cathode and an anode with the cathode connected to said input terminal and the anode connected to the gate of said first field effect transistor as current controlling means for controlling current flow.

* * * * *